(12) United States Patent
Nishimura et al.

(10) Patent No.: US 9,803,286 B2
(45) Date of Patent: Oct. 31, 2017

(54) METHOD FOR ETCHING COPPER LAYER

(71) Applicant: TOKYO ELECTRON LIMITED, Tokyo (JP)

(72) Inventors: Eiichi Nishimura, Miyagi (JP); Keiichi Shimoda, Miyagi (JP); Kei Nakayama, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/512,638

(22) Filed: Oct. 13, 2014

(65) Prior Publication Data

US 2015/0104951 A1    Apr. 16, 2015

(30) Foreign Application Priority Data

Oct. 15, 2013   (JP) .................................. 2013-214911

(51) Int. Cl.
*H01L 21/3065*   (2006.01)
*C23F 4/00*   (2006.01)
*H01L 21/3213*   (2006.01)

(52) U.S. Cl.
CPC .......... *C23F 4/00* (2013.01); *H01L 21/32136* (2013.01); *H01L 21/32139* (2013.01)

(58) Field of Classification Search
CPC ......... H01L 21/32136; H01L 21/32139; H01L 21/3081
See application file for complete search history.

(56) References Cited

U.S. PATENT DOCUMENTS

| | | | |
|---|---|---|---|
| 6,274,499 B1 * | 8/2001 | Gupta | ............... H01L 21/76834 257/E21.304 |
| 6,878,635 B1 | 4/2005 | Nakatani | |
| 2014/0110373 A1 * | 4/2014 | Nishimura | |

FOREIGN PATENT DOCUMENTS

| | | | | |
|---|---|---|---|---|
| EP | 2469582 A2 * | 6/2012 | | |
| JP | 4-99290 A | 3/1992 | | |
| JP | 7-29878 A | 1/1995 | | |
| JP | 07029878 A * | 1/1995 | ......... | H01L 21/3065 |

OTHER PUBLICATIONS

S. Wolf and R.N. Tauber, (Silicon Processing for the VLSI Era, vol. 1—Process Technology, Lattice Press, 1986)(pp. 542-557).*
Fangyu Wu et al., "Low-Temperature Etching of Cu by Hydrogen-Based Plasmas", ACS Applied Materials & Interfaces, 2010, vol. 2, No. 8, p. 2175-2179. (5 pages).
Choi et al., "Low Temperature Cu Etching Using CH4-Based Plasma," ECS Journal of Solid State Science and Technology, Published Oct. 12, 2013, p. 506-p. 514 (9 pages).

* cited by examiner

*Primary Examiner* — Nadine Norton
*Assistant Examiner* — Mahmoud Dahimene
(74) *Attorney, Agent, or Firm* — Rothwell, Figg, Ernst & Manbeck, P.C.

(57) ABSTRACT

Provided is a method of etching a copper layer. The method includes generating plasma of a processing gas within a processing container which accommodates an object to be processed that includes the copper layer and a metal mask formed on the copper layer. The metal mask contains titanium. In addition, the processing gas includes $CH_4$ gas, oxygen gas, and a noble gas. In an exemplary embodiment, the metal mask may include a layer made of TiN.

6 Claims, 9 Drawing Sheets

METHOD FOR ETCHING COPPER LAYER

CROSS-REFERENCE TO RELATED APPLICATIONS

This application is based on and claims priority from Japanese Patent Application No. 2013-214911, filed on Oct. 15, 2013 with the Japan Patent Office, the disclosure of which is incorporated herein in its entirety by reference.

TECHNICAL FIELD

Exemplary embodiments disclosed herein relate to a method of etching a copper layer.

BACKGROUND

In manufacturing a semiconductor device, a process for forming a wiring such as, for example, an interconnection line or a contact, is performed. As for this process, a process called damascene process is used. In the damascene process, a shape such as a groove or a hole is formed in an interlayer insulation film by etching, and a processing of burying a metal material in the formed groove or hole is performed. According to recent miniaturization of a wiring, however, various problems occur in that it becomes difficult to bury a metal material in a fine hole or groove.

In order to cope with the above-described problems in the damascene process, a process has been proposed in which a copper layer is deposited and then the copper layer is etched so as to form a fine copper wiring. Such a process is disclosed in a paper entitled "*Low-Temperature Etching of Cu by Hydrogen-Based Plasma*", Fangyu Wu et al., ACS APPLIED MATERIALS & INTERFACES, 2010, Vol. 2, No. 8, p. 2175-2179. In the process disclosed in the paper, when a copper layer is exposed to plasma of a processing gas containing hydrogen gas and argon gas, the copper layer is etched.

SUMMARY

An aspect of the present disclosure provides a method of etching a copper layer. The method includes generating plasma of a processing gas within a processing container which accommodates an object to be processed (hereinafter, referred to as a "workpiece") which includes the copper layer and a metal mask formed on the copper layer. The metal mask contains titanium. In addition, the processing gas includes $CH_4$ gas, oxygen gas, and a noble gas. In an exemplary embodiment, the metal mask may include a layer made of TiN.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
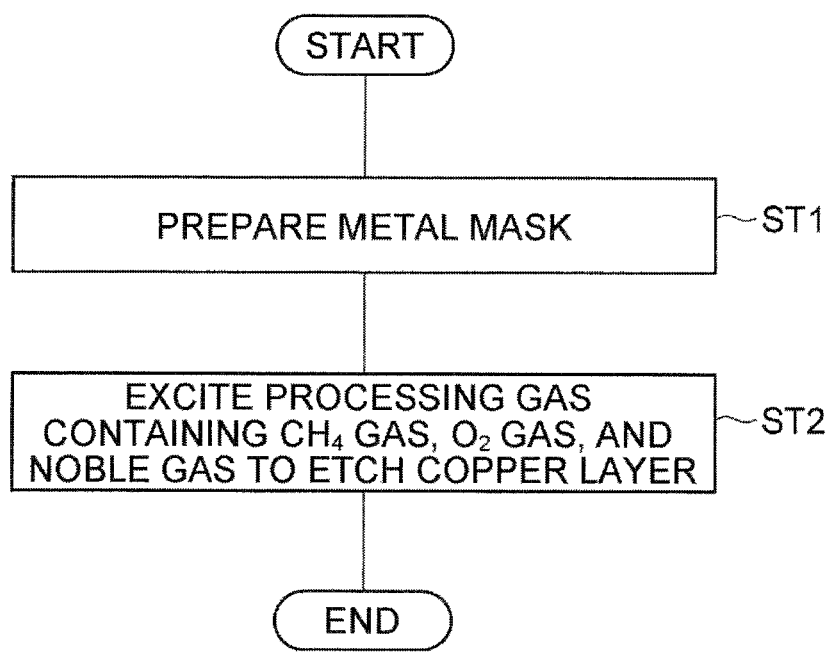
FIG. 1 is a flowchart illustrating an etching method according to an exemplary embodiment.

In the following detailed description, reference is made to the accompanying drawings, which form a part hereof. The illustrative embodiments described in the detailed description, drawings, and claims are not meant to be limiting. Other embodiments may be utilized, and other changes may be made, without departing from the spirit or scope of the subject matter presented here.

As for a mask for etching a copper layer, a metal mask may be used. In an etching process using plasma of a processing gas containing hydrogen gas and argon gas, however, not only the copper layer but also the metal mask may be cut. In addition, in the etching of the copper layer, it is requested that a pattern having a low copper wiring density (hereinafter, referred to as a "low density pattern") and a pattern having a high copper wiring density (hereinafter, referred to as a "high density pattern") be formed simultaneously. That is, it is requested that the copper layer below the space be etched regardless of an area of a space between the metal mask and a shape formed by the etching.

From this background, what is demanded in the art is to etch a copper layer such that a metal mask can be maintained in etching the copper layer and a high density pattern and a low density pattern can be simultaneously formed.

In an aspect, a method of etching a copper layer is provided. The method includes generating plasma of a processing gas within a processing container which accommodates a workpiece that includes the copper layer and a metal mask formed on the copper layer. The metal mask contains titanium. In addition, the processing gas includes $CH_4$ gas, oxygen gas, and a noble gas. In an exemplary embodiment, the metal mask may include a layer made of TiN.

According to the method, a surface of the metal mask may be protected by a protective film containing carbon originated from $CH_4$ gas while the copper layer is etched by the plasma of the processing gas. In addition, the metal mask contains titanium, and an active oxygen species in the plasma facilitates oxidation of the metal mask as compared to the copper layer. Accordingly, the metal mask is capable of being maintained in etching the copper layer. In addition, excessive formation of the protective layer is suppressed by the active oxygen species in the plasma. Accordingly, an active species contributing to the etching of the copper layer may enter both a wide space and a narrow space. As a result, a high density pattern and a low density pattern may be simultaneously formed.

In an exemplary embodiment, when generating the plasma, a pressure within the processing container may be set to be 50 mTorr (6.666 Pa) or less. When the copper layer is etched under such a low pressure environment, a rectilinear advancing property of ions in the plasma in a vertical direction may be enhanced. As a result, a verticality of a shape formed by the etching of the copper layer may be enhanced.

In an exemplary embodiment, when generating the plasma, a temperature of a mounting table on which the workpiece is mounted may be set to be in a range of 80° C. to 120° C. When the copper layer is etched on the mounting table set to a temperature in this range, the oxidation of the metal mask may be facilitated while suppressing the oxidation of the copper layer.

In an exemplary embodiment, a ratio of a flow rate of the oxygen gas in relation to a flow rate of the $CH_4$ gas may be in a range of 1/4 to 3/2. When the flow rate of the oxygen gas and the flow rate of the $CH_4$ gas are controlled to be a ratio within such a range, it is possible to control the protective film to be a proper amount while suppressing the oxidation of the copper layer.

As described above, it is possible to etch a copper layer in such a manner as to maintain a metal mask in etching the copper layer, and form a high density pattern and a low density pattern simultaneously.

Hereinafter, various exemplary embodiments will be described in detail with reference to accompanying drawings. Meanwhile, similar elements in each drawing will be denoted by similar symbols.

FIG. 1 is a flowchart illustrating an etching method according to an exemplary embodiment. The method illustrated in FIG. 1 includes step ST2 of etching a copper layer. In step ST2 in the method, a copper layer is etched. In step ST2, plasma of a processing gas including $CH_4$ gas, oxygen gas ($O_2$ gas), and a noble gas is generated and the copper layer is etched by the plasma. In addition, in the present exemplary embodiment, the method illustrated in FIG. 1 performs step ST1 prior to step ST2. In step ST1, a metal mask is prepared on the copper layer.

Figure 2:
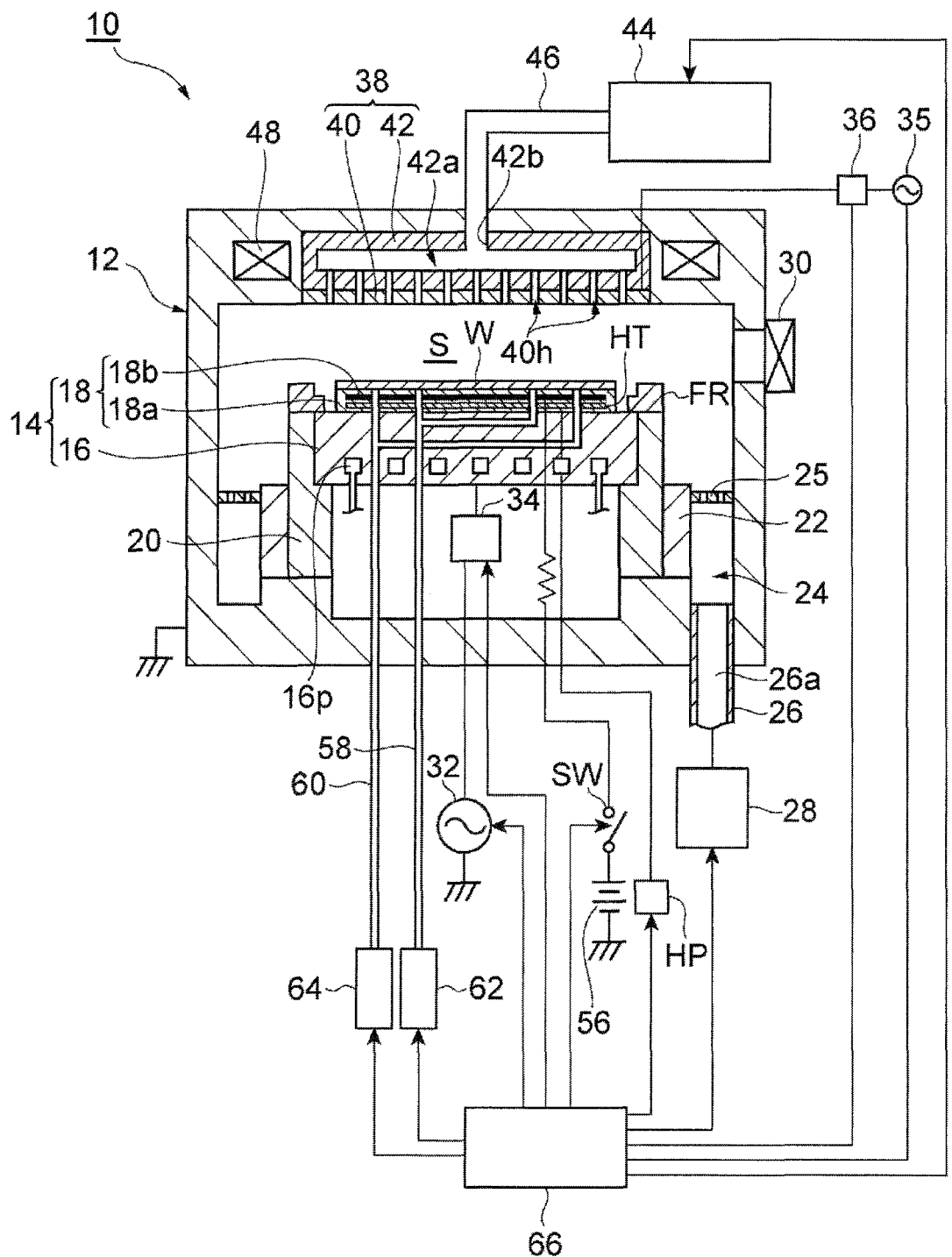
FIG. 2 is a view illustrating an exemplary plasma processing apparatus which may be used for performing the etching method according to the exemplary embodiment.

FIG. 2 schematically illustrates an exemplary plasma processing apparatus which may be used for performing the etching method according to the exemplary embodiment illustrated in FIG. 1. FIG. 2 illustrates a cross-sectional view illustrating a plasma processing apparatus according to an exemplary embodiment. The plasma processing apparatus 10 illustrated in FIG. 2 is a capacitively coupled plasma processing apparatus.

As illustrated in FIG. 2, the plasma processing apparatus 10 is provided with a processing container 12. The processing container 12 defines a processing space S therein. The processing space S is sealed and configured to be capable of being decompressed. The processing container 12 includes a side wall which has a substantially cylindrical shape. A gate valve 30 is attached to the side wall of the processing container 12 so as to open/close a carry-in/carry-out port of a workpiece (hereinafter, referred to as a "wafer W").

The plasma processing apparatus 10 is provided with a mounting table 14 within the processing container 12. The mounting table 14 includes a base 16 and an electrostatic chuck 18. The base 16 has substantially a disc shape and is conductive. The base 16 is made of, for example, aluminum and constitutes a lower electrode.

The mounting table 14 is provided with a temperature control mechanism for a wafer W. As a part of a temperature control function, a coolant flow path 16p is formed inside the base 16. A coolant inlet pipe and a coolant outlet pipe may be connected to the coolant flow path 16p. The mounting table 14 is configured such that the base 16 and the electrostatic chuck 18 may be controlled to a predetermined temperature by circulating a proper coolant such as, for example, cooling water, in the coolant flow path 16p.

The plasma processing apparatus 10 is further provided with a cylindrical holding unit 20 and a cylindrical support unit 22. The cylindrical holding unit 20 is in contact with a side surface and an edge of a bottom surface of the base 16 to hold the base 16. The cylindrical support unit 22 extends in a vertical direction from the bottom of the processing container 12. The cylindrical support unit 22 supports the base 16 via the cylindrical holding unit 20.

An electrostatic chuck 18 is installed on the top of the base 16. The electrostatic chuck 18 is a substantially disc-shaped member, and includes an insulation layer 18a and a power feeding layer 18b. The insulation layer 18a is a film formed by an insulative material such as, for example, ceramic. The power feeding layer 18b is a conductive film formed as an inner layer of the insulation layer 18a. A direct current (DC) power source 56 is connected to the power feeding layer 18b through a switch SW. When a DC voltage is applied to the power feeding layer 18b from the DC power source 56, a Coulomb force is generated, and the wafer W is attracted onto the electrostatic chuck 18 by the Coulomb force. A focus ring FR is provided outside the electrostatic chuck 18. The focus ring FR is a flat annular member extending annularly along an edge of the electrostatic chuck 18 and an edge of the wafer W. The focus ring FR may be made of, for example, silicon or quartz.

In addition, as a part of a temperature adjustment mechanism, a heater HT serving as a heating element is buried in the electrostatic chuck 18. The heater HT is electrically connected to a heater power source HP. In addition, as a part of the temperature adjustment mechanism, the plasma processing apparatus 10 further includes gas supply lines 58 and 60, and heat transfer gas supply units 62 and 64. The heat transfer gas supply unit 62 is connected to the gas supply line 58. The gas supply line 58 extends to the top surface of the electrostatic chuck 18 and extends annularly at a central portion of the top surface. The heat transfer gas supply unit 62 supplies a heat transfer gas, for example, He gas, to a gap between the top surface of the electrostatic chuck 18 and the wafer W. In addition, the heat transfer gas supply unit 64 is connected to the gas supply line 60. The gas supply line 60 extends to the top surface of the electrostatic chuck 18 and extends annularly on the top surface to surround the gas supply line 58. The heat transfer gas supply unit 64 supplies a heat transfer gas, for example, He gas, to the gap between the top surface of the electrostatic chuck 18 and the wafer W.

An exhaust path 24 is formed between the side wall of the processing container 12 and the cylindrical support unit 22. A baffle plate 25 is installed in an inlet or on a midway of the exhaust path 24. The baffle plate 25 is formed with a plurality of through holes which extend in the vertical direction. In addition, an exhaust port 26a is formed at the lower end of the exhaust path 24. The exhaust port 26a is provided by an exhaust tube 26 fitted in the bottom of the processing container 12. An exhaust apparatus 28 is connected to the exhaust tube 26. The exhaust apparatus 28 includes a vacuum pump so that the processing space S within the processing container 12 can be decompressed to a predetermined degree of vacuum.

A high frequency power source 32 is electrically connected to the base 16 via a matching device 34. In an exemplary embodiment, the high frequency power source 32 supplies a high frequency bias power having a predetermined frequency for ion drawing-in to the base 16. The frequency of the high frequency bias power is in a range of, for example, 300 kHz to 27 MHz, and in an example, 400 kHz.

In addition, the plasma processing apparatus 10 is provided with a shower head 38. The shower head 38 is provided above the mounting table 14. The shower head 38 includes an electrode plate 40 and an electrode support 42.

The electrode plate 40 is a conductive plate having substantially a disc shape and constitutes an upper electrode.

A high frequency power source 35 is electrically connected to the electrode plate 40 via the matching device 36. The high frequency power source 35 supplies a high frequency power having a predetermined frequency for plasma generation to the electrode plate 40. The frequency of the high frequency power generated in the high frequency power source 35 is higher than, for example, 27 MHz, and, in an example, the frequency is 60 MHz.

A plurality of gas jetting ports 40h is formed in the electrode plate 40. The electrode plate 40 is removably supported by the electrode support 42. A buffer chamber 42a is formed within the electrode support 42. In addition, the plasma processing apparatus 10 is further provided with a gas supply unit 44. The gas supply unit 44 is connected to a gas introduction port 42b of the buffer chamber 42a through a gas supply duct 46. The gas supply unit 44 outputs a processing gas of a gas species according to a process in a predetermined flow rate.

The electrode support 42 is formed with a plurality of holes which are continuous to the plurality of gas jetting ports 40h, respectively. The plurality of holes is communicated with the buffer chamber 42a. Accordingly, the processing gas supplied from the gas supply unit 44 is supplied to the processing space S via the buffer chamber 42a and the gas jetting ports 40h.

In an exemplary embodiment, a magnetic field forming mechanism 48 extending annularly or concentrically is installed in a ceiling portion of the processing container 12. The magnetic field forming mechanism 48 functions to facilitate initiation of high frequency discharge (ignition of plasma) in the processing space S so that the discharge can be stably maintained.

In addition, the plasma processing apparatus 10 is further provided with a control unit 66. The control unit 66 is connected to the exhaust apparatus 28, the switch SW, the high frequency power source 32, the matching device 34, the high frequency power source 35, the matching device 36, the gas supply unit 44, the heat transfer gas supply units 62 and 64, and the heater power source HP. The control unit 66 transmits a control signal to each of the exhaust apparatus 28, the switch SW, the high frequency power source 32, the matching device 34, the high frequency power source 35, the matching device 36, the gas supply unit 44, the heat transfer gas supply units 62 and 64, and the heater power source HP. Based on the control signal from the control unit 66, evacuation by the exhaust apparatus 28, ON/OFF of the switch SW, power supply from the high frequency power source 32, impedance adjustment of the matching device 34, power supply from the high frequency power source 35, impedance adjustment of the matching device 36, supply of a processing gas by the gas supply unit 44, supply of a heat transfer gas by each of the heat transfer gas supply units 62 and 64, or power supply from the heater power source HP is controlled.

In the plasma processing apparatus 10, the processing gas is supplied from the gas supply unit 44 to the processing space S. In addition, a high frequency power is applied to the electrode plate 40 by the high frequency power source 35. As a result, a high frequency electric field is generated in a space between the base 16 and the electrode plate 40, i.e. in the processing space S. The processing gas is excited by the high frequency electric field to generate plasma in the processing space S. A wafer W is processed by species such as, for example, radicals or ions of elements included in the plasma. In addition, a high frequency bias power is supplied to the base 16 by the high frequency power source 32. When the high frequency bias power is supplied to the base 16, the ions in the plasma are accelerated and the accelerated ions are irradiated toward the wafer W.

Figure 3C:
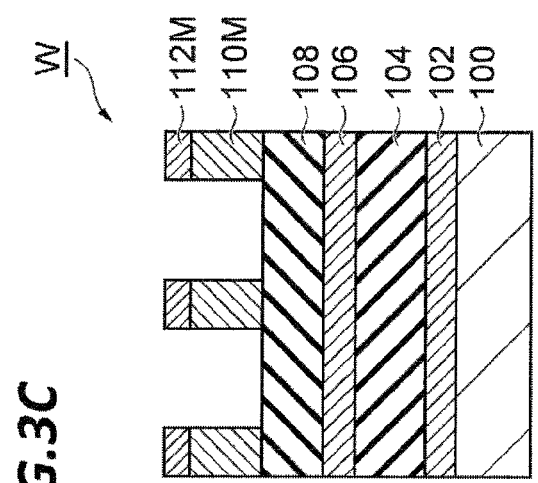
FIGS. 3A to 3E are cross-sectional views illustrating states of a wafer after respective processings.
Figure 3B:
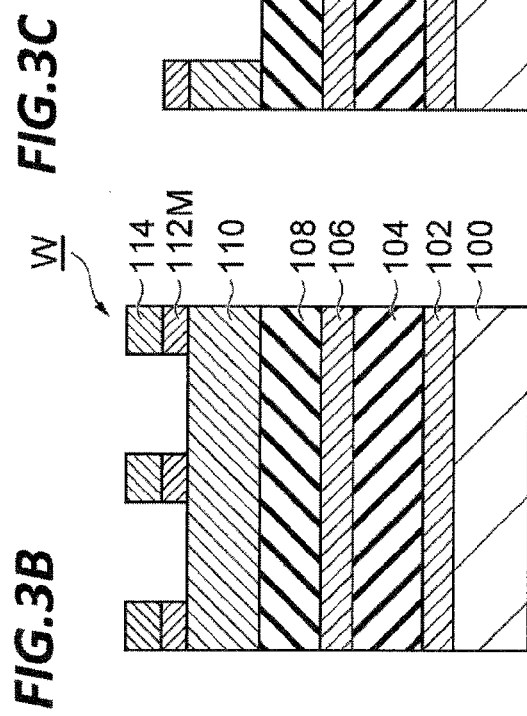
Figure 3E:
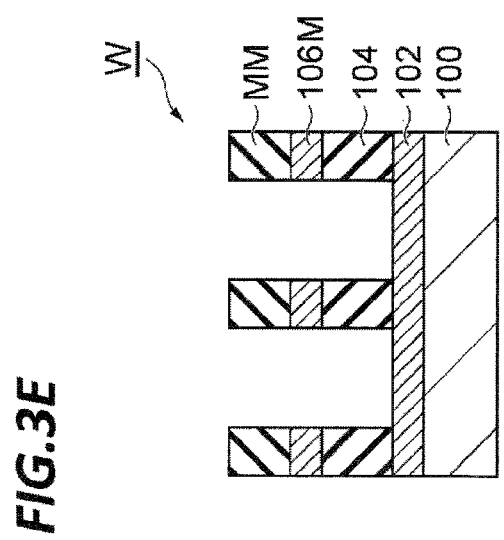
Figure 3A:
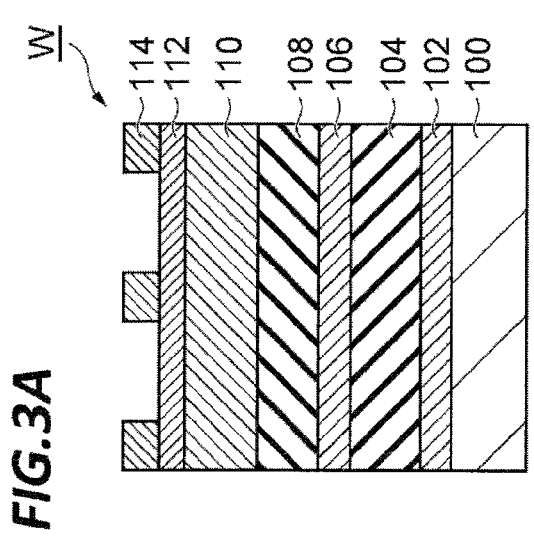

Hereinafter, the details of the method illustrated in FIG. 1 will be described with reference to FIGS. 3A to 3E together with FIG. 1. FIGS. 3A to 3E are cross-sectional views illustrating states of a wafer after respective processings, respectively. First, in step ST1, a metal mask is prepared. FIG. 3A illustrates a wafer W in a step prior to preparing the metal mask. As illustrated in FIG. 3A, the wafer W is provided with a substrate 100, a base layer 102, a copper layer 104, an upper layer 106, a metal layer 108, a first layer 110, a second layer 112, and a resist mask 114.

The substrate 100 is, for example, a Si substrate. The base layer 102 is formed on the substrate 100, the copper layer 104 is formed on the base layer 102, and the upper layer 106 is formed on the copper layer 104. The metal layer 108 is formed on the upper layer 106. The metal layer 108 is a layer containing titanium (Ti) and becomes a metal mask MM. In an exemplary embodiment, the metal layer 108 is a TiN layer. The first layer 110, the second layer 112, and the resist mask 114 are laminated on the metal layer 108 in this order.

In an example, the base layer 102 and the upper layer 106 are made of tantalum (Ta), the first layer 110 is formed by SOG (Spin On Glass), and the second layer 112 is made of SiOC. In another example, the base layer 102 is made of a low dielectric constant material so-called a Low-K material, the upper layer 106 is made of silicon nitride, the first layer 110 is made of an organic film containing carbon, and the second layer 112 is made of SiOC.

In step ST1, the second layer 112 is etched. The second layer 112 is etched by, for example, generating plasma of a fluorocarbon-based gas in the plasma processing apparatus 10, and exposing the wafer W to the plasma. As a result, a pattern of the resist mask 114 is transferred to the second layer 112 to form a mask 112M as illustrated in FIG. 3B.

Subsequently, the first layer 110 is etched. The first layer 110 is etched by, for example, generating plasma of oxygen gas in the plasma processing apparatus 10 and exposing the wafer W to the plasma. As a result, the pattern of the mask 112M is transferred to the first layer 110 to form a mask 110M as illustrated in FIG. 3C.

Figure 3D:
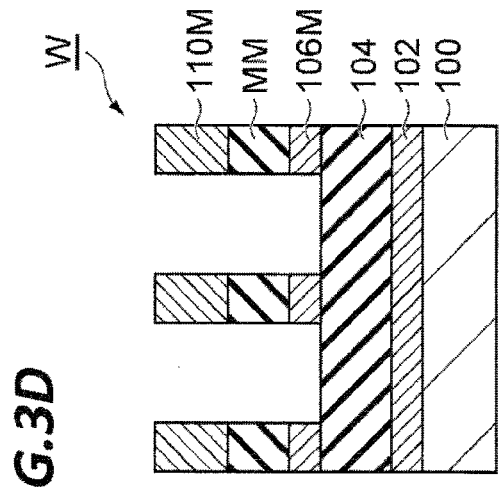

Subsequently, the metal layer 108 is etched. In addition, the upper layer 106 is etched following the metal layer 108. The metal layer 108 and the upper layer 106 are etched by, for example, generating plasma of a halogen-based gas in the plasma processing apparatus 10, and exposing the wafer W to the plasma. The halogen-based gas contains, for example, fluorine. As a result, the pattern of the mask 110M is transferred to the metal layer 108 to form a metal mask MM as illustrated in FIG. 3D. In addition, the upper layer 106 becomes a layer 106M according to the shape of the metal mask MM.

Figure 4:
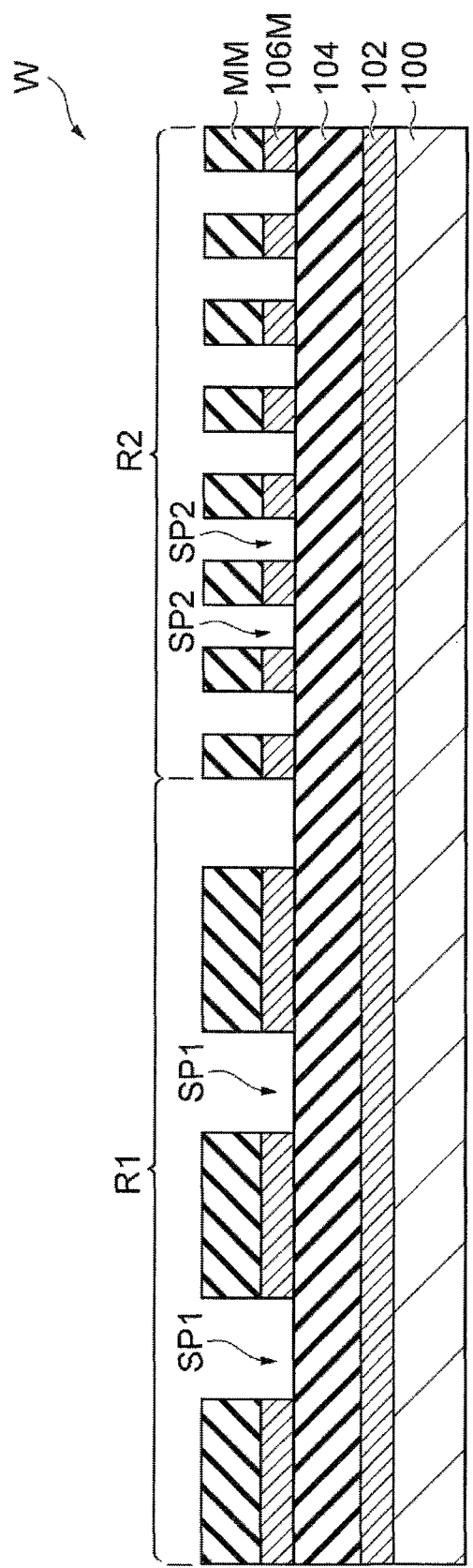
FIG. 4 is a cross-sectional view illustrating an exemplary workpiece which includes a metal mask and a copper layer.

Here, reference is made to FIG. 4. FIG. 4 is a cross-sectional view illustrating an exemplary workpiece which includes a metal mask and a copper layer. As illustrated in FIG. 4, in an exemplary embodiment, the wafer W includes a first region R1 and a second region R2. The first region R1 is a region in which a low density pattern is formed by etching the copper layer 104, and the second region R2 is a region in which a high density pattern is formed by etching the copper layer 104. For this reason, an area of a space SP1 defined by the metal mask MM of the first region R1 is larger than an area of a space SP2 defined by the metal mask MM of the second region R2. That is, the metal mask MM of the second region R2 is formed more densely than the metal mask of the first region R1. For example, when the pattern of the metal mask MM is a line and space pattern, each of a line width and a space width of the metal mask MM in the second region R2 is 60 nm or less. In step ST2 of the method illustrated in FIG. 1, the copper layer 104 below the spaces SP1 and SP2 of the metal mask MM is etched in both the first region R1 and the second region R2.

In step ST2, within the processing container of the plasma processing apparatus in which the wafer W illustrated in FIG. 3D is accommodated, plasma of a processing gas including $CH_4$ gas, oxygen gas ($O_2$ gas), and a noble gas is generated and the wafer W is exposed to the plasma. As a result, as illustrated in FIG. 3E, the wafer W is in a state where the pattern of the metal mask MM is transferred to the copper layer 104. Meanwhile, the noble gas is, for example, Ar gas. In addition, the noble gas may be another noble gas such as, for example, Xe gas or Ne gas. Hereinafter, step ST2 will be described, assuming that the noble gas is Ar gas.

Figure 5:
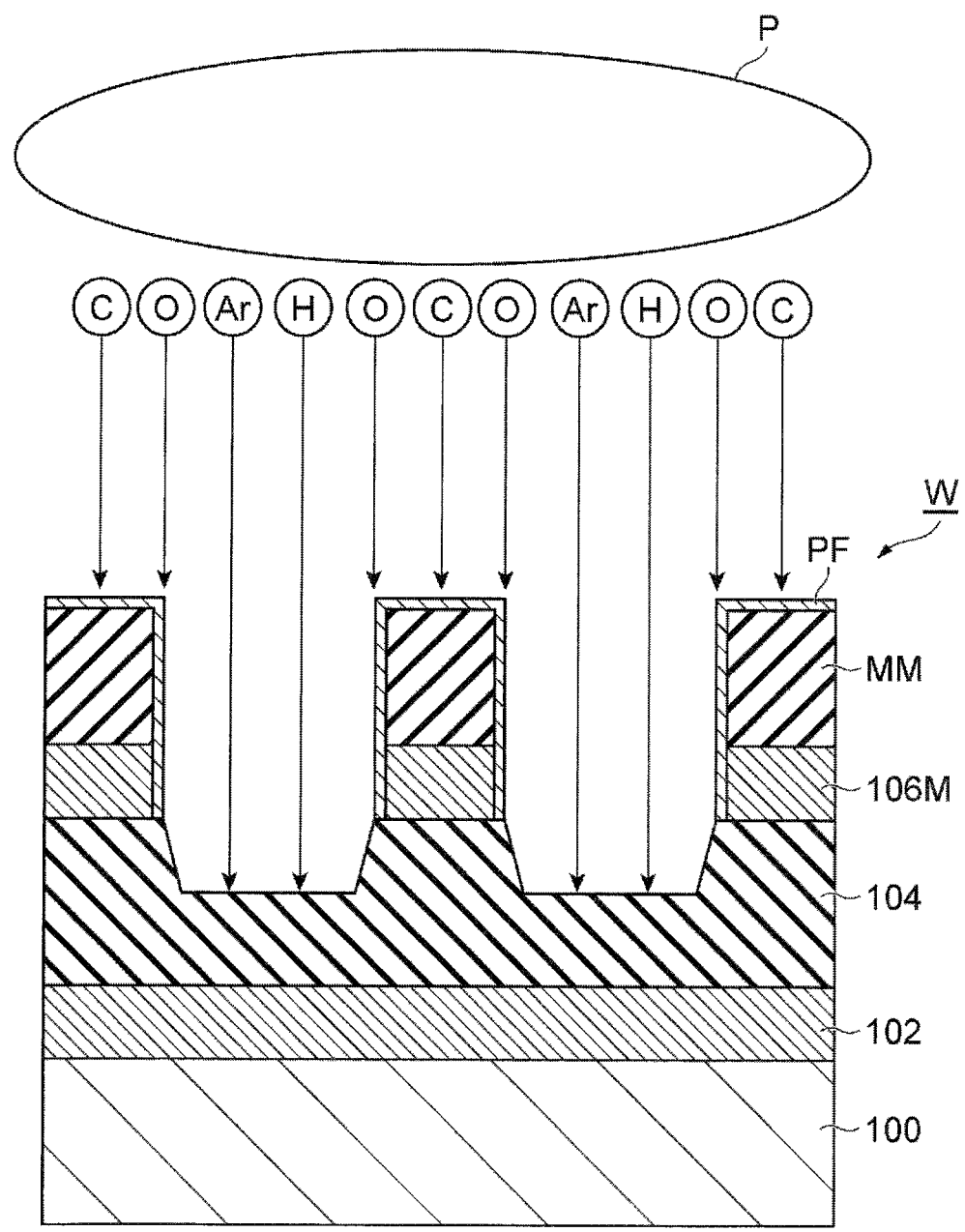
FIG. 5 is a view for describing a principle of step ST2.

FIG. 5 is a view for describing a principle of step ST2. As illustrated in FIG. 5, in step ST2, hydrogen ions are generated due to dissociation of the $CH_4$ gas, and Ar ions are generated due to dissociation of the noble gas. The hydrogen ions and the Ar ions are drawn into the wafer W by the high frequency bias power supplied to the lower electrode. As a result, the copper layer 104 is etched. In FIG. 5, "H" enclosed by a circle indicates a hydrogen ion, and "Ar" enclosed by a circle indicates an argon ion.

In addition, in step ST2, active carbon and/or hydrocarbon species are generated due to the dissociation of the $CH_4$ gas. In addition, active oxygen species are generated due to dissociation of the oxygen gas. In FIG. 5, "C" enclosed by a circle indicates an active carbon and/or hydrocarbon species, and an "O" enclosed by a circle indicates an active oxygen species. In step ST2, the metal mask MM is oxidated by the active oxygen species, and the metal mask MM is cured. In addition, a protective film PF containing carbon is formed on a surface of the metal mask MM by the active carbon and/or hydrocarbon species. As a result, the metal mask MM is maintained until step ST2 is finished.

In addition, in step ST2, excessive deposition of the active carbon and/or hydrocarbon species is suppressed by the active oxygen species. That is, the protective film PF with a proper thickness is maintained on the surface of the metal mask MM by the active oxygen species. In particular, in the second region R2, when the active carbon and/or hydrocarbon species is excessively deposited on the metal mask MM, the protective film PF blocks the space SP2 so that the hydrogen ions and the Ar ions are hindered from arriving at the copper layer 104. However, in step ST2, since the active oxygen species suppress the excessive deposition of the active carbon and/or hydrocarbon species, the hydrogen ions and the Ar ions may enter the space SP2 of the second region R2 as well as the space SP1 of the first region R1. Accordingly, in step ST2, it is possible to form a high density pattern and a low density pattern simultaneously.

In addition, in step ST2, the copper layer 104 is etched without using a halogen-based gas. Accordingly, it is possible to etch the copper layer 104 without causing passivation by bonding of Cu and a halogen element.

In step ST2 of the exemplary embodiment, the pressure within the processing container of the plasma processing apparatus is set to be 50 mTorr (6.666 Pa) or less. Within the processing container set to such a pressure, an ion density is reduced and a rectilinear advancing property of the ions in the vertical direction is enhanced. As a result, it is possible to enhance verticality of a shape formed by etching the copper layer 104.

In addition, in step ST2 in the exemplary embodiment, the temperature of the mounting table 14, in particular, the surface temperature of the electrostatic chuck 18 is set to be in a range of 80° C. to 120° C. When the copper layer 104 is etched on the mounting table 14 having a temperature set in this range, the oxidation of the copper layer 104 may be suppressed, and the oxidation of the metal mask MM may be facilitated.

Further, in step ST2 in the exemplary embodiment, a ratio of a flow rate of the $CH_4$ gas to a flow rate of the oxygen gas is set to be in a range of 1/4 to 3/2. When the flow rate of the oxygen gas and the flow rate of the $CH_4$ gate set in this ratio, it is possible to suppress the oxidation of the copper layer 104 and control the deposition amount of the protective film PF to a proper amount.

Hereinafter, test examples in which the plasma processing apparatus 10 was used for evaluating step ST2 will be described.

Test Example 1

In Test Example 1, step ST2 was performed on a wafer in which a metal mask made of TiN was formed on a copper layer. The metal mask had a line and space pattern having a line width of 60 nm and a space width of 60 nm. In addition, the thickness of the copper layer was 50 nm and the thickness of the metal mask was 50 nm. In Test Example 1, the pressure within the processing container 12 in step ST2 was variously changed. Other conditions in Test Example 1 are as follows.

<Conditions in Test Example 1>

High frequency power of high frequency power source 35: 60 MHz, 500 W

High frequency power of high frequency power source 32: 400 kHz, 500 W

Processing time: 300 sec

Flow rate of $CH_4$ gas/flow rate of Ar gas/flow rate of $O_2$ gas: 150 sccm/200 sccm/100 sccm Temperature of electrostatic chuck 18: 80° C.

Figure 6:
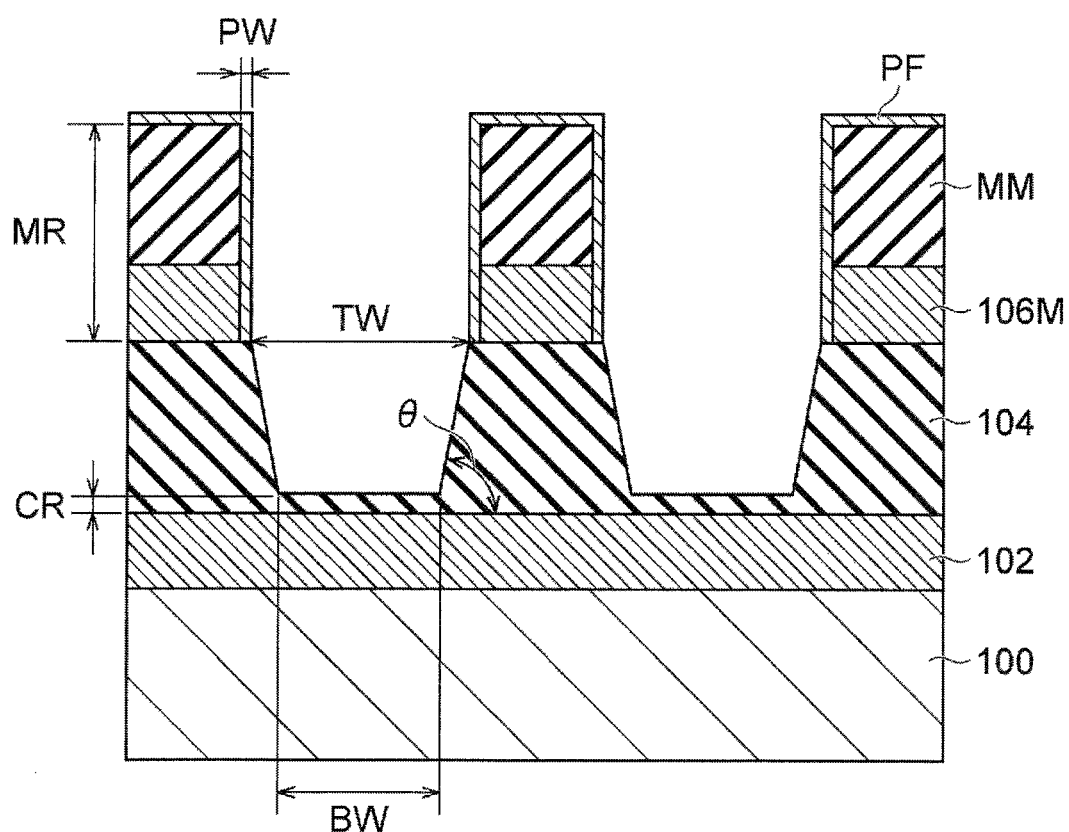
FIG. 6 is a view for describing sizes measured in test examples.

In Test Example 1, an SEM photograph of a wafer W after step ST2 was taken and various sizes were measured. FIG. 6 is a view for describing sizes measured in the test examples. Specifically, in Test Example 1, after step ST2, a remaining film thickness CR of the copper layer 104, a film thickness MR of a metal mask MM, a thickness PW of a protective film PF on a side surface of the metal mask MM, and a taper angle θ of a side wall of the copper layer 104 were measured.

Figure 7:
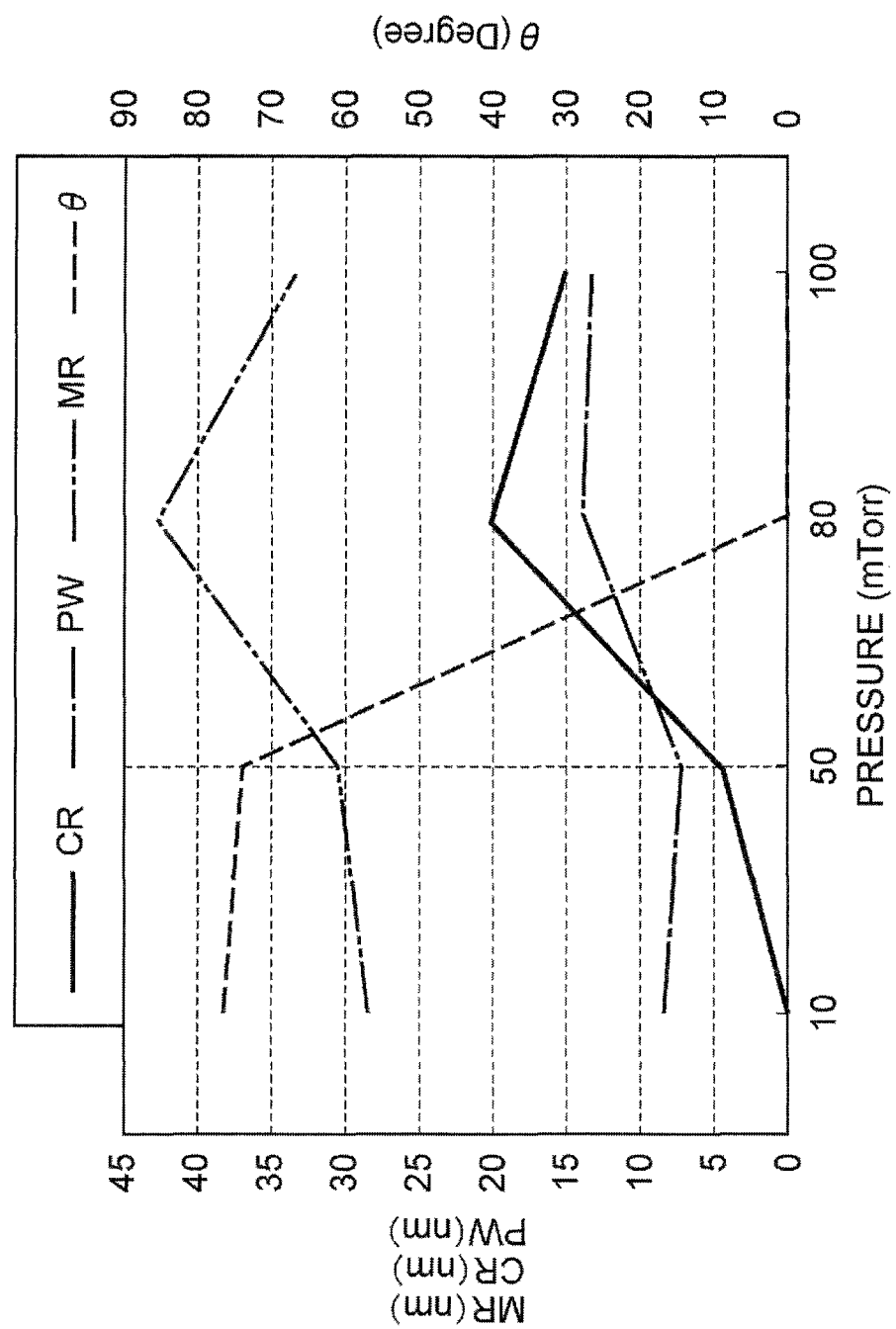
FIG. 7 is a graph representing results of Test Example 1.

FIG. 7 is a graph representing results of Test Example 1. In FIG. 7, the horizontal axis represents a pressure within the processing container 12 in step ST2, the left vertical axis represents a film thickness MR of a metal mask MM, and a remaining film thickness CR of a copper layer 104, and a thickness PW of a protective film PF on a side surface of the metal mask MM after step ST2, and the right vertical axis represents a taper angle θ of a side wall of the copper layer 104 after step ST2.

As illustrated in FIG. 7, when the pressure within the processing container in step ST2 was set to be 50 mTorr or less, the taper angle θ of the side wall of the copper layer 104 was approximately 90 degrees, and the remaining film thickness CR of the copper layer 104 was reduced. In addition, when the pressure within the processing container in step ST2 was set to be 50 mTorr or less, the film thickness MR of the metal mask MM and the thickness PW of the protective film PF after step ST2 became a proper level. Meanwhile, when the pressure within the processing container in step ST2 was set to be 50 mTorr or more, the taper angle θ was considerably smaller than 90 degrees and the remaining film thickness CR of the copper layer 104 was increased. In addition, when the pressure within the processing container in step ST2 was set to be higher than 50 mTorr, the film thickness MR of the metal mask MM and the thickness PW of the protective film PF tended to increase. From Test Example 1, it was found that when the pressure within the processing container in step ST2 is set to be 50 mTorr or less, it is possible to enhance verticality of a shape formed by etching the copper layer 104 as well as the etching rate of the copper layer 104.

Test Example 2

In Test Example 2, the processing in step ST2 was performed on a wafer which is the same as that in Test Example 1 while variously changing a flow rate ratio of flow rate of $O_2$ gas and flow rate of $CH_4$ gas. Specifically, step ST2 was performed in a state where a ratio of flow rate of $O_2$ gas/flow rate of $CH_4$ gas was set to 4/1, 3/2, 2/3, and 1/4. Other conditions of Test Example 2 are as follows.
<Conditions of Test Example 2>
High frequency power of the high frequency power source 35: 60 Hz, 500 W
High frequency power of the high frequency power source 32: 400 Hz, 500 W
Processing time: 300 sec
Temperature of the electrostatic chuck 18: 80° C.
Pressure within the processing container 12: 10 mTorr (1.333 Pa)

Figure 8:
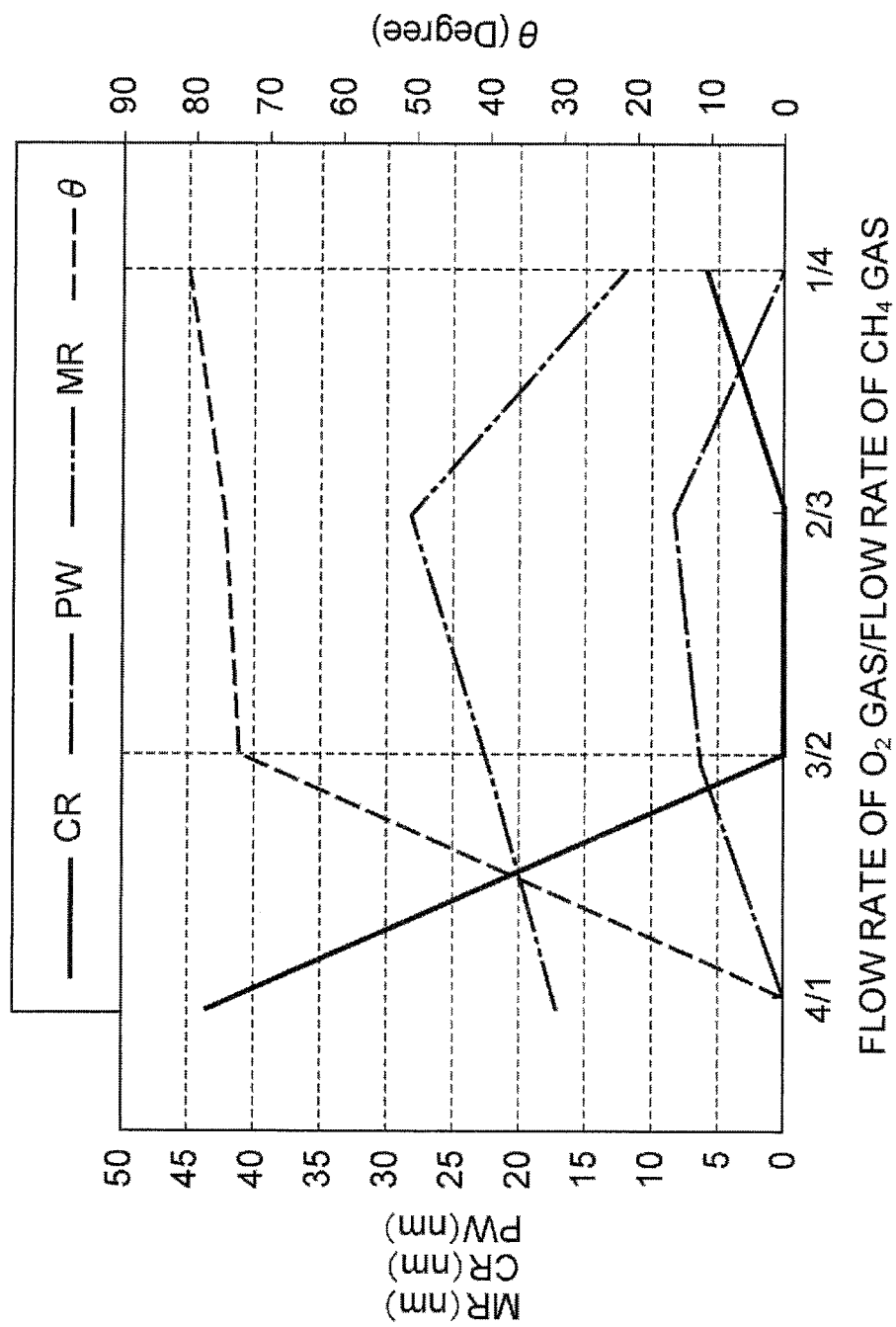
FIG. 8 is a graph representing results of Test Example 2.

In Test Example 2, an SEM photograph of a wafer W after step ST2 was also taken. From the SEM photograph, a remaining film thickness CR of a copper layer 104, a film thickness MR of a meal mask MM, a thickness PW of a protective film PF, and a taper angle θ of a side wall of the copper layer 104 after step 2 were measured. FIG. 8 is a graph representing results of Test Example 2. In FIG. 8, the horizontal axis represents a ratio of flow rate of $O_2$ gas/flow rate of $CH_4$ gas, the left vertical axis represents a film thickness MR of a meal mask MM, a remaining film thickness CR of a copper layer 104, and a thickness PW of the protective film PF after step ST2, and the right vertical axis represents a taper angle θ of a side wall of the copper layer 104 after step 2.

As illustrated in FIG. 8, when the ratio of flow rate of $O_2$ gas/flow rate of $CH_4$ gas was set in a range of 1/4 to 3/2, the remaining film thickness CR of the copper layer 104 was thin, and the taper angle θ was about 90 degrees. In addition, when the ratio of flow rate of $O_2$ gas/flow rate of $CH_4$ gas was set to be in a range of 1/4 to 3/2, the film thickness MR of the metal mask MM and the thickness PW of the protective film PF after step ST2 became a proper level. Meanwhile, when the ratio of flow rate of $O_2$ gas/flow rate of $CH_4$ gas was set to be larger than 3/2 (a ratio of 4/1), the remaining film thickness CR of the copper layer 104 was increased. It is believed that this result was caused since the copper layer 104 was excessively oxidized because the flow rate of $O_2$ gas is excessively high in relation to the flow rate of $CH_4$ gas. In addition, although not illustrated in FIG. 8, when the ratio of flow rate of $O_2$ gas/flow rate of $CH_4$ gas was set to be smaller than 1/4, the thickness PW of the protective film PF was excessively increased to hinder the etching of the copper layer. From Test Example 2, it was found that when the ratio of flow rate of $O_2$ gas/flow rate of $CH_4$ gas is set to be in a range of 1/4 to 3/2, it is possible to control the deposition amount of the protective film to a proper level while suppressing the oxidation of the copper layer.

Test Example 3

In Test Example 3, step ST2 was performed on a wafer in which a metal mask of a line and space pattern was formed on a copper layer. The wafer had a first region and a second region, and the metal mask had a line width of 200 nm and a space width of 200 nm in the first region and had a line width of 60 nm and a space width of 60 nm in the second region. The thickness of the copper layer was 50 nm and the thickness of the metal mask was 50 nm. In Test Example 3, the surface temperature of the electrostatic chuck 18 in step ST2 was variously changed. Other conditions in Test Example 3 are as follows.
<Conditions of Test Example 3>
High frequency power of the high frequency power source 35: 60 MHz, 500 W
High frequency power of the high frequency power source 32: 400 kHz, 500 W
Processing time of step ST2: 300 sec
Flow rate of $CH_4$ gas/flow rate of Ar gas/flow rate of $O_2$ gas: 150 sccm/200 sccm/100 sccm
Pressure within the processing container 12: 10 mTorr (1.333 Pa)

In Test Example 3, an SEM photograph after step ST2 was taken, and a reduced amount of the film thickness by the processing of step ST2 was calculated from the SEM photograph, and the etching rate of the copper layer was calculated from the reduced amount. In addition, from the SEM photograph, the thickness PW of the protective film PF on a side surface of the metal mask MM after step ST2 was measured. Meanwhile, the etching rate was calculated for both the first region and the second region. In addition, the thickness PW of the protective film PF was obtained only for the second region.

Figure 9:
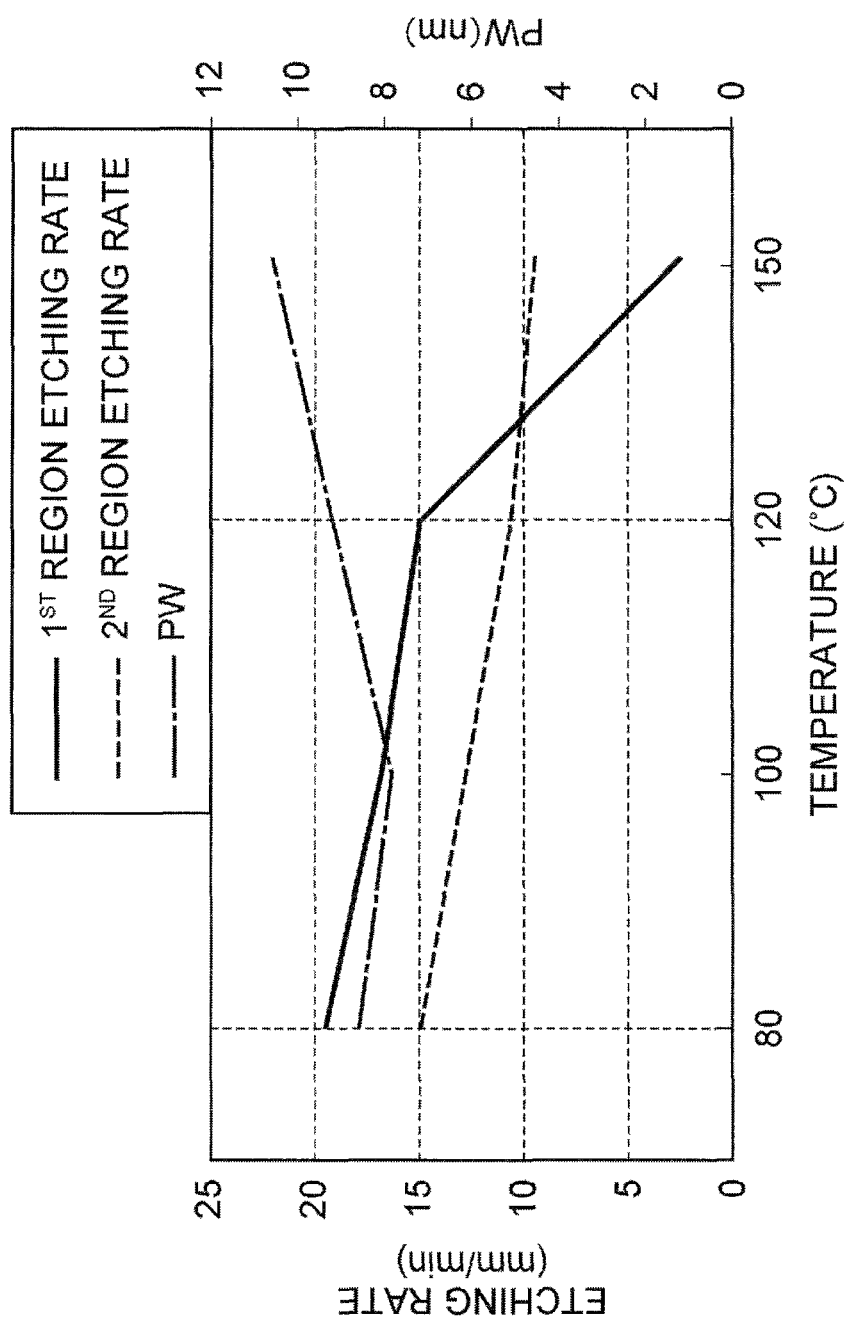
FIG. 9 is a graph representing results of Test Example 3.

FIG. 9 is a graph representing results of Test Example 3. In FIG. 9, the horizontal axis represents a surface temperature of the electrostatic chuck 18 in step ST2, the left vertical axis represents an etching rate of a copper layer, and the right vertical axis represents a thickness PW of a protective film PF on a side surface of the metal mask MM.

As illustrated in FIG. 9, when the surface temperature of the electrostatic chuck 18 in step ST2 was set to be in a range of 80° C. to 120° C., the copper layer was etched at a high etching rate in both the first region and the second region. In addition, when the surface temperature of the electrostatic chuck 18 in step ST2 was set to be in a range of 80° C. to 120° C., the thickness PW of the protective film PF after step ST2 became a proper level. Meanwhile, although not illustrated in FIG. 9, when the surface temperature of the electrostatic chuck 18 in step ST2 was set to be lower than 80° C., the metal mask tended to be easily cut. It is believed that this result was caused because the metal mask was not sufficiently oxidized at the temperature lower than 80° C. In addition, when the surface temperature of the electrostatic chuck 18 in step ST2 was set to be higher than 120° C. (150° C.), the etching rate of the copper layer was reduced. It is believed that this result was caused because the copper layer was excessively oxidized at the temperature higher than 120° C. Accordingly, it was found that when the surface temperature of the electrostatic chuck 18 in step ST2 is set to be in the range of 80° C. to 120° C., it is possible to facilitate the oxidation of the metal mask while suppressing the oxidation of the copper layer.

Although various exemplary embodiments have been described in the foregoing, various modified embodiments may be made without being limited to the above-described exemplary embodiments. For example, although in the plasma processing apparatus 10, the high frequency power source 35 is connected to the upper electrode, and the high frequency power source 32 is connected to the lower electrode, both the high frequency power sources 32 and 35 may be connected to the lower electrode. In addition, for performing the method illustrated in FIG. 1, a plasma processing apparatus other than the capacitively coupled plasma processing apparatus, for example, an inductively coupled plasma processing apparatus, a surface wave plasma processing apparatus configured to excite a processing gas by surface waves such as microwaves, or an electron cyclotron resonance (ECR) plasma processing apparatus, may be used.

From the foregoing, it will be appreciated that various exemplary embodiments of the present disclosure have been described herein for purposes of illustration, and that various modifications may be made without departing from the scope and spirit of the present disclosure. Accordingly, the various exemplary embodiments disclosed herein are not intended to be limiting, with the true scope and spirit being indicated by the following claims.

What is claimed is:

1. A method of etching comprising:
   providing an object to be processed including a copper layer and an upper layer disposed on the copper layer within a processing container including a lower electrode on which the object to be processed is accommodated;
   forming a metal mask on the upper layer by applying a metal layer containing titanium on the upper layer and patterning the metal layer along with the upper layer with a predetermined pattern;
   supplying a processing gas including $CH_4$ gas, oxygen gas, and a Ar gas within the processing container;
   generating plasma of the processing gas within the processing container which accommodates the object to be processed that includes the copper layer, the upper layer, and the metal mask such that (i) hydrogen ions and active carbon and/or hydrocarbon species are generated due to dissociation of the $CH_4$ gas, (ii) Ar ions are generated due to dissociation of the Ar gas, and (iii) active oxygen species are generated due to dissociation of the oxygen gas; and
   supplying a radio frequency bias power to the lower electrode in order to draw the active carbon and/or hydrocarbon species, the active oxygen species, the hydrogen ions, and the Ar ions onto the object to be processed such that the metal mask is oxidized to be cured by the active oxygen species, a protective film containing carbon is formed on a surface of the metal mask by the active carbon and/or hydrocarbon species, and the copper layer is etched using the metal mask including the protective film as an etching mask while maintaining the plasma within the processing container,
   wherein forming the metal mask includes the steps of:
   (i) etching a silicon containing layer located below a resist mask to transfer a pattern of the resist mask to the silicon containing layer to form a silicon containing layer mask,
   (ii) etching an organic film layer located below the silicon containing layer mask to transfer a pattern of the silicon containing layer mask to the organic film layer to form an organic film layer mask, and
   (iii) etching the metal layer located below the organic film layer mask to transfer a pattern of the organic film layer mask to the metal layer to form the metal mask.

2. The method of claim 1, wherein, in the generating of the plasma, a pressure within the processing container is set to be 6.666 Pa or less.

3. The method of claim 1, wherein the metal mask includes a layer made of TiN.

4. The method of claim 1, wherein forming the metal mask includes a step of:
   etching a silicon containing layer located below a resist mask to transfer a pattern of the resist mask to the silicon containing layer to form a silicon containing layer mask.

5. The method of claim 4, wherein forming the metal mask further includes a step of:
   etching an organic film layer located below the silicon containing layer mask to transfer a pattern of the silicon containing layer mask to the organic film layer to form an organic film layer mask.

6. The method of claim 1, wherein, in the generating of the plasma, a temperature of a mounting table on which the object to be processed is mounted is set to be in a range of 80° C. to 120° C., and wherein a ratio of a flow rate of the oxygen gas in relation to a flow rate of the $CH_4$ gas is in a range of 1/4 to 3/2.

* * * * *